(12) United States Patent
Yang et al.

(10) Patent No.: US 6,411,542 B1
(45) Date of Patent: Jun. 25, 2002

(54) FERROELECTRIC MEMORY DEVICE HAVING FERROELECTRIC MEMORY TRANSISTORS CONNECTED TO SEPARATE WELL LINES

(75) Inventors: Yil Suk Yang; Byoung Gon Yu; In Kyu You; Won Jae Lee; Kyoung Ik Cho, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/966,112

(22) Filed: Oct. 1, 2001

Related U.S. Application Data

(63) Continuation-in-part of application No. 09/475,123, filed on Dec. 30, 1999, now abandoned.

(30) Foreign Application Priority Data

Dec. 15, 1999 (KR) .............................................. 99-58026

(51) Int. Cl.$^7$ ................................................ G11C 11/22
(52) U.S. Cl. ...................... 365/145; 365/65; 365/230.06
(58) Field of Search ................................. 365/145, 186, 365/230.06, 65, 117

(56) References Cited

U.S. PATENT DOCUMENTS

| | | | | |
|---|---|---|---|---|
| 5,309,391 A | * | 5/1994 | Papaliolios | 365/145 |
| 5,592,409 A | | 1/1997 | Nishimura et al. | 365/145 |
| 5,822,240 A | * | 10/1998 | Yoo | 365/145 |
| 6,023,438 A | * | 2/2000 | Tanaka et al. | 365/210 |
| 6,147,895 A | * | 11/2000 | Kamp | 365/145 |
| 6,288,961 B1 | * | 9/2001 | Tanaka et al. | 365/210 |
| 6,317,356 B1 | * | 11/2001 | Hoffmann et al. | 365/145 |

OTHER PUBLICATIONS

Nakamura, et al., ISSCC 95/Session 4/Technology Directions Displays, Photonics and Ferroelectric Memories; Feb. 15, 1995, pp. 68, 69 & 340.

Ishiwara, et al., "Proposal of a Single Transistor Cell Type Ferroelectric Memory Using an SOI Structure and Experimental Study on the Interface Problem in the Write Operation", JJAP, vol. 36 (1997), Mar. 1997, pp. 1655–1658.

* cited by examiner

*Primary Examiner*—Andrew Q. Tran
(74) *Attorney, Agent, or Firm*—Jacobson Holman, PLLC

(57) ABSTRACT

A ferroelectric memory device including a single ferroelectric transistor that one unit memory cell is independently selected and programmed, when the unit memory cell is programmed for "the first state" or "the second state" by applying a DC bias voltage to the single ferroelectric transistor's gate and well. In addition, the ferroelectric memory device can be applied with normal power level Vdd and GND. The ferroelectric memory device includes a plurality of unit memory cells which are arranged in a matrix, by crossing at least one word line in a column direction with a plurality of bit lines and source lines in a row direction and is connected between the source line and the bit line.

7 Claims, 8 Drawing Sheets

FERROELECTRIC MEMORY DEVICE HAVING FERROELECTRIC MEMORY TRANSISTORS CONNECTED TO SEPARATE WELL LINES

This is a Continuation-In-Part of application Ser. No. 09/475,123 filed Dec. 30, 1999, now abandoned.

BACKGROUND OF THE INVENTION

1. Field of the Invention

The present invention relates to a semiconductor device structure and memory implementation; and more particularly, relates to a technique for integrating ferroelectric device and metal-oxide-semiconductor (MOS) transistor.

2. Prior Art of the Invention

In general, a MOS transistor uses $SiO_2$ oxide film as gate thin film and the operations of the MOS transistor is controlled by a threshold voltage responding to a gate voltage. On the other hand, a single ferroelectric transistor is under the control of polarization characteristic of a ferroelectric device, using $Pb(zr,Ti)O_3(PZT)$, or $SrBi_2Ta_2O_9$ (SBT), etc. for gate thin film. A non-volatile ferroelectric memory device stores data using hysteresis characteristic between voltage and accumulated electric charge. There are some non-volatile ferroelectric memory devices of which unit memory device is composed of single transistor and single ferroelectric capacitor, or single ferroelectric transistor. FIG. 1 is a graph illustrating the hysteresis characteristic between voltage and electric charge of a normal ferroelectric device. When applied voltage V is "0V", electric charges Q have two different states C, E. Thus, a ferroelectric device lies in different polarization states, "the first state" or "the second state". Namely, a polarization state of a ferroelectric device is arranged for a regular direction, then, it lies in "the first state" or "the second state". FIGS. 2A and 2B are two schematic cross-sectional views illustrating the operation principle of an N-channel single ferroelectric transistor. When a voltage of gate to P-Si is positive(+), electric charges are induced on silicon surface. On the contrary, when a voltage of gate to P-Si is negative(−), any electric charge is not induced. FIG. 3 is a graph illustrating the hysteresis characteristic between drain current and gate voltage of a single ferroelectric transistor. The drain current $I_d$ depends on when the gate voltage $V_g$ increases or decreases. Also, FIG. 4a and 4b are schematic circuit diagrams illustrating memory cell arrangement of a ferroelectric memory device having a single ferroelectric transistor, using usual techniques. A plurality of unit memory cells are organized in a matrix type, by crossing a plurality of word line $WL_1-WL_n$, a plurality of bit line $BL_1-BL_m$ and source line $SL_1-SL_n$. A unit memory cell is connected between source lines $SL_1-SL_n$ and bit lines $BL_1-BL_m$. Single ferroelectric transistors $FM_1$, $FM_m$, $FM_n$, $FM_{n+m}$ are arranged with connecting gates to word lines $WL_1-WL_n$. For programming an arbitrarily selected unit memory cell for "the first state" in a memory cell of the ferroelectric memory device illustrated in FIGS. 4A and 4B, a supply voltage $V_{dd}$ is applied to the corresponding word line of the unit memory cell and the corresponding bit line, source line and common well line WELL are grounded. In addition, for preventing the other unselected unit memory cells from being programmed for "the first state", a ground voltage is applied to the corresponding word line and source voltages is applied to source line, bit line and common well line. Here, the write disturb phenomenon is generated in the unselected unit memory cells, when the grounded voltage is applied to the gate of a single ferroelectric transistor and the source voltages are applied to the drain and the common well line. Namely, it is the case that "the first state" is wrongly programmed for the unselected unit memory cell. When the write disturb phenomenon is generated, or when wrong data are programmed for the unselected unit memory, the data are damaged because normal data programmed for "the first state", for instant, are changed to "the second state". Also, for programming the selected unit memory cell for "the second state", the grounded voltage is applied to the corresponding word line and the source voltage is applied to the corresponding bit line, source line and common well line. In this case, since specific memory cell is not able to be selected from a plurality of unit memory cells, a voltage should be applied commonly to the arranged whole ferroelectric transistor.

SUMMARY OF THE INVENTION

An object of the present invention is to provide a ferroelectric memory device organized into unit ferroelectric transistors, which can select one unit memory cell and to program it, when the unit memory cell is programmed for "the first state" or "the second state". An additional object of this invention is to provide a ferroelectric memory device organized into unit ferroelectric transistors, in which there is no Write Disturb phenomenon when a program for the unit memory cell operates.

A ferroelectric memory device in accordance with one aspect of the present invention comprises a plurality of unit memory cells arranged in a matrix type. A plurality of word lines are arranged in column direction and a plurality of bit lines and source lines are arranged in row direction and crossed the plurality of word lines and each memory cell is connected between the source line and the bit line. The unit memory cell comprises a single ferroelectric transistor whose gate is connected to the corresponding word line. The single ferroelectric transistor comprises a well which is coupled to one common well line in row direction and is electrically isolated from common well lines of adjacent different rows. Also, the single ferroelectric transistor comprises a source commonly connected to the bit line or the source line in row direction and comprises a drain commonly connected to the bit line or the source line in row direction.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

Figure 1:
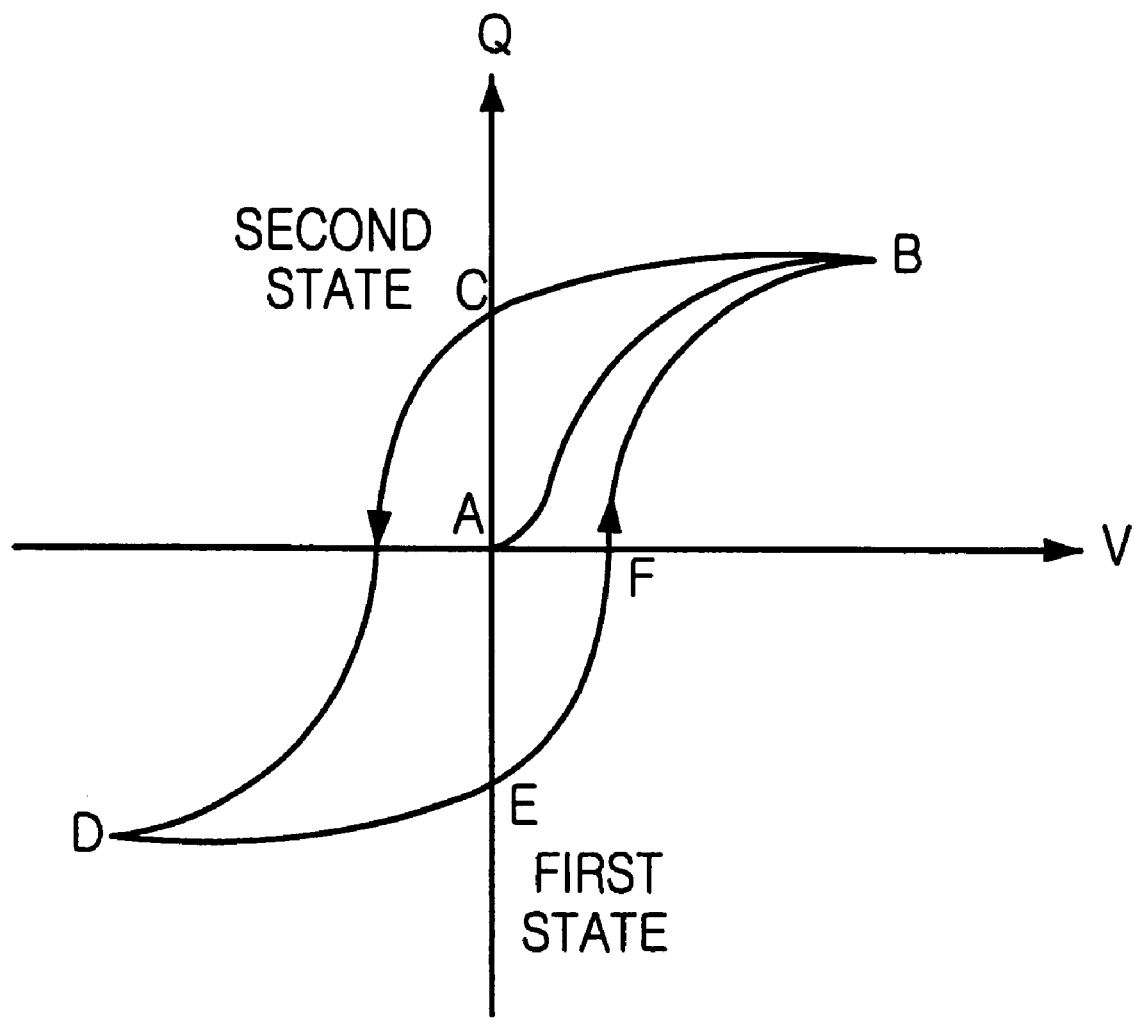
FIG. 1 is a graph illustrating the hysteresis characteristic between voltage and electric charge of a normal ferroelectric device.
Figure 2A:
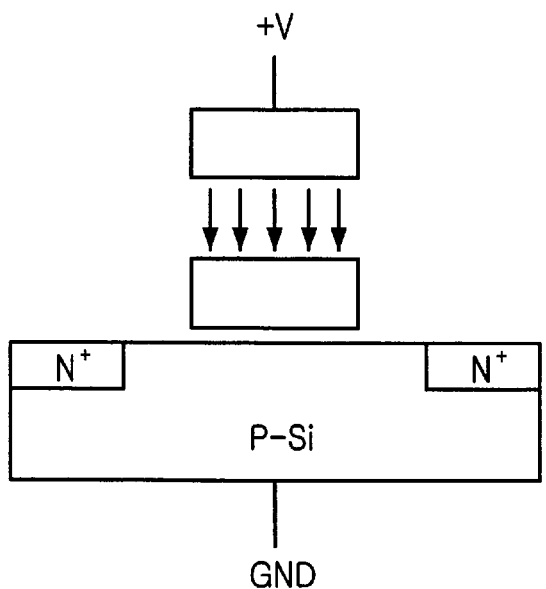
FIGS. 2A and 2B are two schematic cross-sectional views illustrating the operation principle of an N-channel single ferroelectric transistor.
Figure 2B:
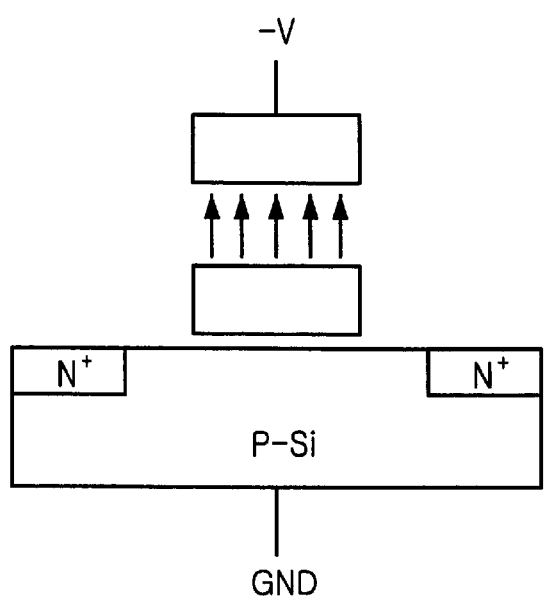
Figure 3:
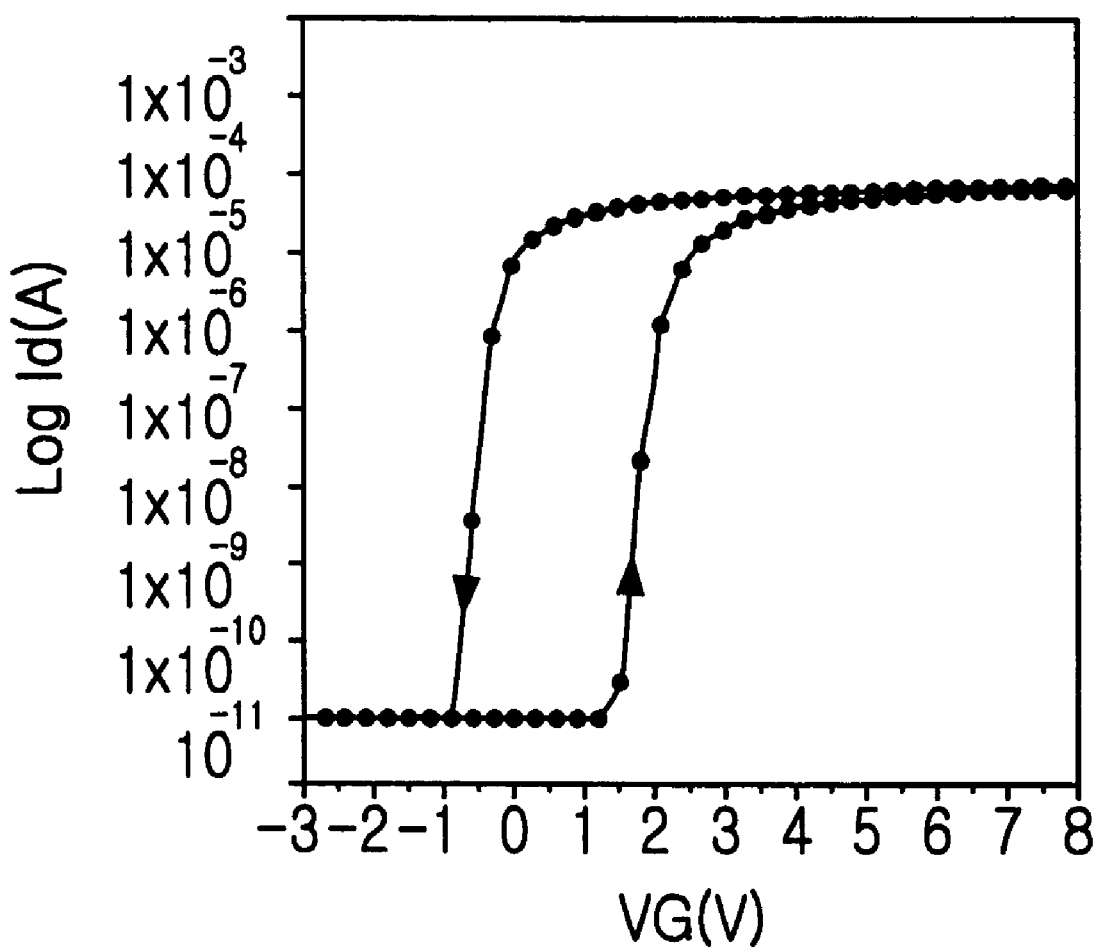
FIG. 3 is a graph illustrating the hysteresis characteristic between drain current and gate voltage of a single ferroelectric transistor.
Figure 4B:
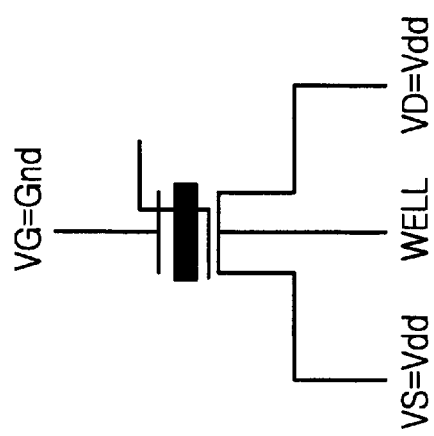
FIGS. 4A and 4B are two schematic circuit diagrams illustrating a memory cell arrangement of a ferroelectric memory device having a single ferroelectric transistor, using usual techniques.
Figure 4A:
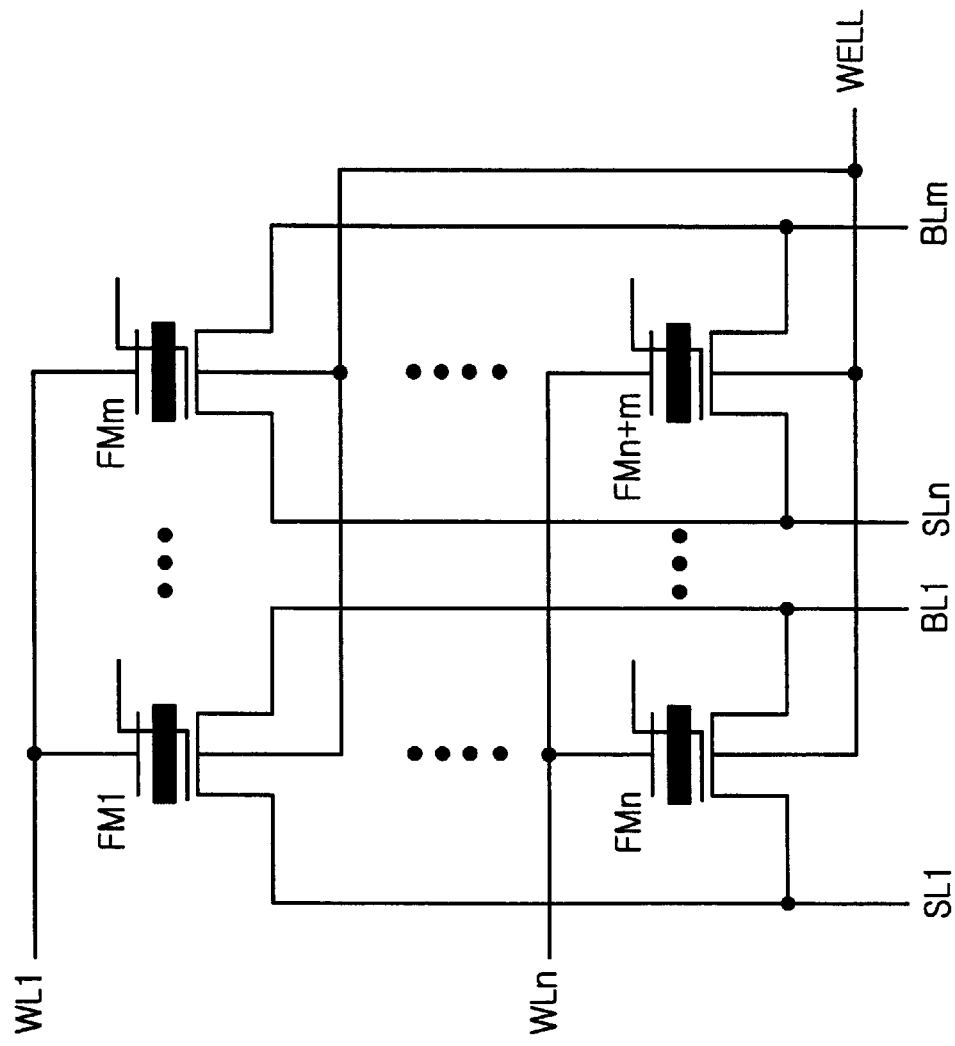
Figure 5A:
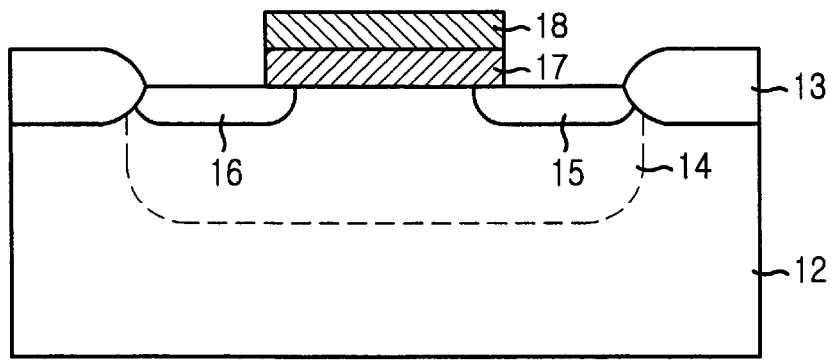
FIGS. 5A and 5B are a schematic cross-sectional view and a schematic circuit illustrating the structure and signal of a normal single ferroelectric transistor.
Figure 5B:
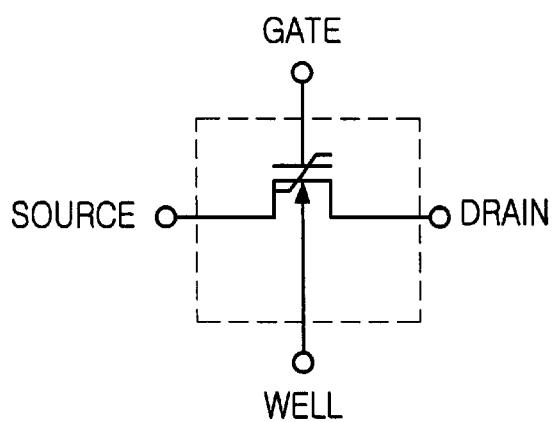

FIGS. 5A and 5B are a schematic cross-sectional view and an equivalent circuit diagram of FIG. 5A illustrating a structure of a single ferroelectric transistor 10.

Referring to FIG. 5A, there is shown the single ferroelectric transistor 10 including a substrate 12, an isolation 13, a well 14, a pair of diffusion regions 15 and 16, a thin film ferroelectric layer 17 and a gate oxide layer 18. In the transistor 10, a conduction type of the well 14 is opposed to those of the diffusion regions 15 and 16. It should be noted that the conduction type of the well 14 is similar or opposed to that of the substrate 12. It is preferable that a material of the thin film ferroelectric layer 17 is selected from the group consisting of PZT(PbZrTiOx), SBT(SrBiTaOx) or the like. However, any material having ferroelectric characteristic can be used.

FIG. 5B is an equivalent circuit diagram illustrating the single ferroelectric transistor 10 shown in FIG. 5A. A memory cell including a single ferroelectric transistor is programmed for "the first state" or "the second state". For reading accumulated data, a suitable operating bias voltage is applied to the gate, the source and the drain. Basically a memory cell including a single ferroelectric transistor, is programmed when a gate voltage to a well voltage is positive (+) and is not programmed when a gate voltage to a well voltage is negative (−).

Figure 6:
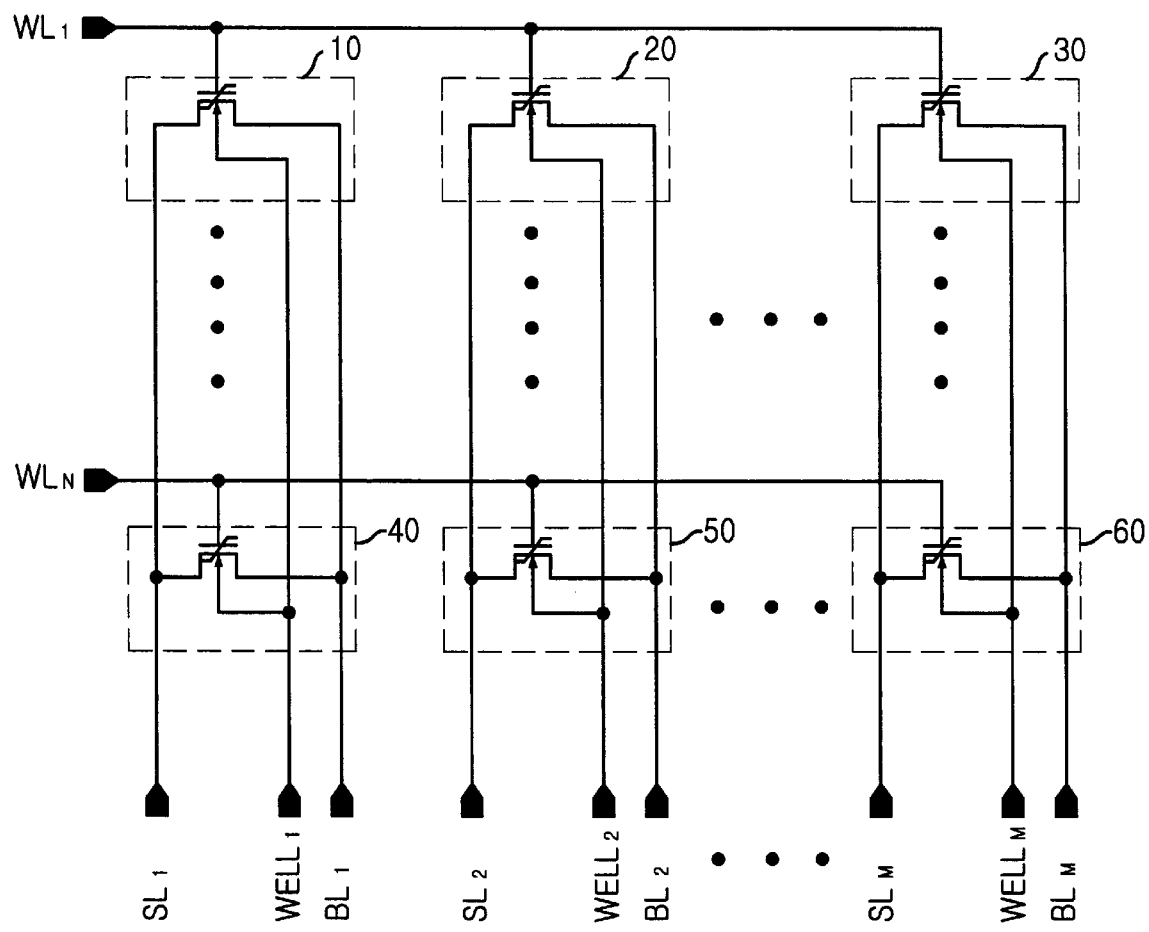
FIG. 6 is a schematic circuit diagram illustrating a memory cell arrangement of a ferroelectric memory device organized a single ferroelectric transistor.

FIG. 6 is a schematic circuit diagram illustrating a memory cell arrangement of a ferroelectric device including an array of M×N single ferroelectric transistors, M and N being a positive integer, respectively. The M and N represent the number of unit memory cells in a row direction and the number of unit memory cells in a column direction, respectively.

A plurality of unit memory cells are organized in a matrix, by crossing N number of word lines $WL_1-WL_N$ with M number of bit lines $BL_1-BL_M$ and source lines $SL_1-SL_M$. In the preferred embodiment of the present invention, each column in the ferroelectric device includes N number of unit memory cells. Each of the ferroelectric transistors in the array is arranged in such a way that the ferroelectric transistors in each row are commonly connected to a corresponding word line. Here, the ferroelectric transistors' wells in each column are connected to a corresponding one of well lines $WELL_1-WELL_M$. Also, the ferroelectric transistor's sources and drains are arranged in such a way that sources and drains in each column are commonly connected to a corresponding one of bit lines $BL_1-BL_M$ and a corresponding one of source lines $SL_1-SL_M$.

As the foregoing illustration, in a memory arrangement of the ferroelectric memory device, the source lines and the drain lines are commonly used as column lines. Well lines are also commonly used as column lines. So, the column lines are electrically isolated from each other. In other words, since the column well lines of adjacent different columns are electrically disconnected, a voltage can be selectively applied to each well of any column through the column well lines $WELL_1-WELL_M$.

The following illustrate programming for an arbitrary unit memory cell organized the unit ferroelectric transistor.

First of all, the word lines hold on to the GND and the column well lines hold on to the Vdd in the reset state of the ferroelectric memory device. So, the polarization is initiated by the voltage difference of the ferroelectric transistor's gate to the well.

For programming the corresponding unit memory cell 10 for "the first state", the source voltage Vdd is applied to the corresponding word line WL1 connected to the unit ferroelectric transistor's gate and the ground voltage GND is applied to the column well line WELL1. Since the voltage difference of the unit ferroelectric transistor's gate to the well is positive (+), the corresponding unit memory cell is programmed.

Here, memory cells 20 and 30 among the unselected unit memories which are connected commonly to the word line $WL_1$ of the selected unit memory cell 10, hold on to the initial polarization state by applying the source voltage $V_{dd}$ to the corresponding unit ferroelectric transistor's well and the gate. Also, the other unselected unit memory cells 40, 50 and 60 hold on to the initial polarization state by applying the source voltage $V_{dd}$ to the corresponding unit ferroelectric transistor's well and by grounding the gate. In this way, the write disturb phenomenon is not generated.

Next, for programming the corresponding unit memory cell 10 for "the second state", the ground voltage GND is applied to the corresponding word line $WL_1$ connected the single ferroelectric transistor's gate and the source voltage is applied to the common well line $WELL_1$. Since the voltage difference of the unit ferroelectric transistor's gate to the well is negative(−), then the corresponding unit memory cell 10 is programmed for non-programmed state, namely "the second state".

Here, memory cells 20 and 30 among the unselected unit memories, which are connected commonly to the word line $WL_1$ of the selected unit memory cell 10, hold on to the initial polarization state by applying the ground voltage GND to the corresponding unit ferroelectric transistor's well and the gate. Also, the other unselected unit memory cells 40, 50, 60 hold on to the initial polarization state by applying the ground voltage GND to the corresponding unit ferroelectric transistor's well and by applying the source voltage $V_{dd}$ to the gate.

The single ferroelectric transistor is N-channel type transistor in the foregoing illustrations, if a single ferroelectric transistor is P-channel type transistor, the programming of a unit memory cell is different from programming in foregoing illustrations of "the first state" and "the second state".

When the unit memory cell is programmed by applying the DC bias voltage to all the single ferroelectric capacitor's gate and the well, it is easy to generate bipolar one pulse for driving the single ferroelectric memory device and implement a decoder.

Figure 7:
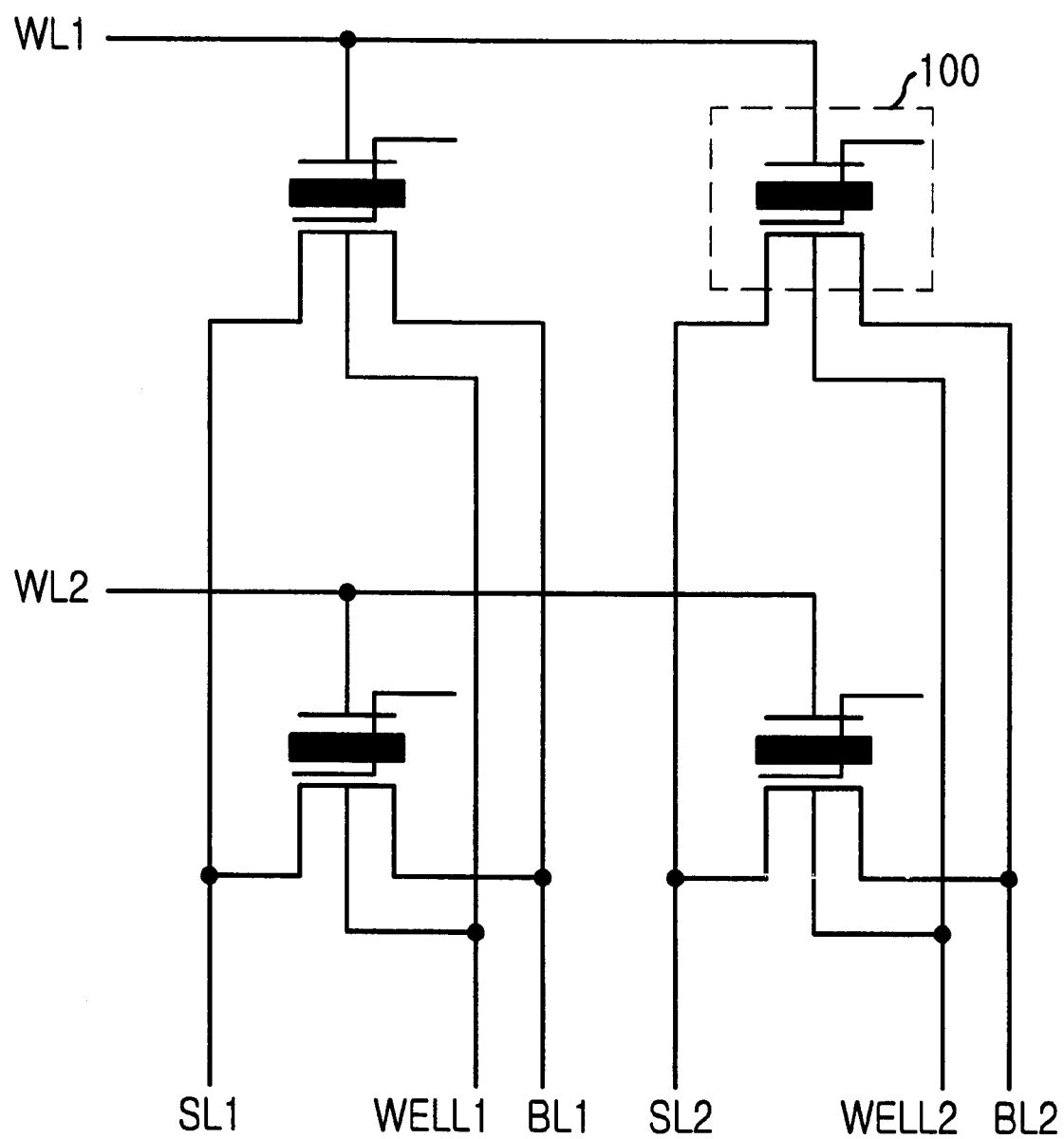
FIG. 7 is a schematic circuit diagram illustrating a 2×2 memory cell arrangement of the ferroelectric memory device.

FIG. 7 is a schematic circuit diagram illustrating a 2×2 memory cell arrangement of the ferroelectric memory device. For selecting a specified cell 200 in the 2×2 memory cell, the common word line $WL_1$ of the specified cell 100 is driven from $V_{dd}$ to GND. Here, because the other unselected cell's word line $WL_2$ holds on to be applied with the ground voltage GND and the row well line WELL holds on to be applied with the source voltage $V_{dd}$, the voltage difference of the specified cell 100's gate to the well is $V_{dd}$ and the voltage difference of the other unselected cells' gate to the well is $-V_{dd}$ or "0" (when a cell is commonly connected to the specified cell 100 and the word line $WL_1$). So, it is possible to selectively program the specified cell 100.

Figure 8:
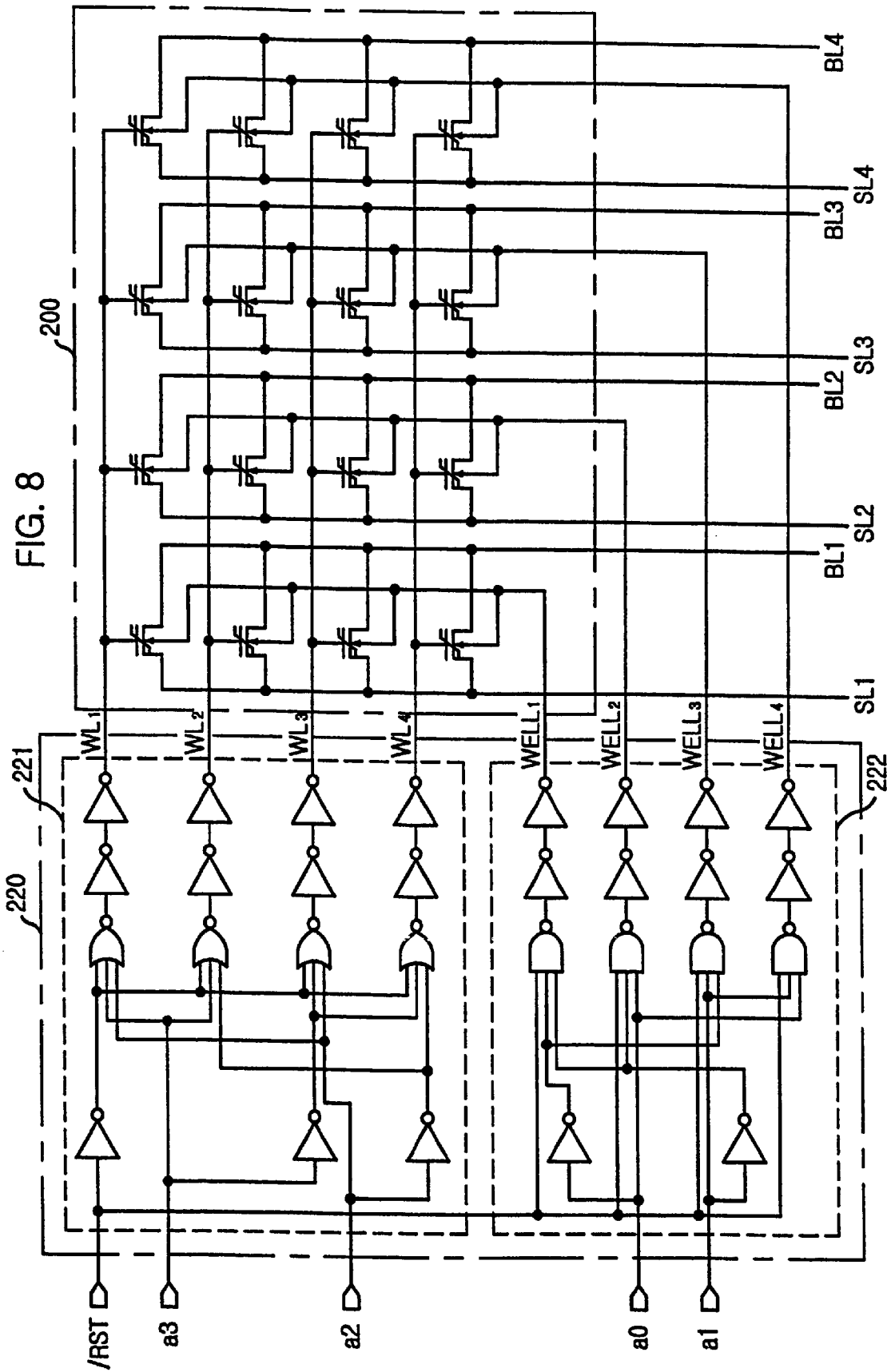
FIG. 8 is a schematic circuit diagram illustrating a 4×4 memory cell arrangement and a decoder of the ferroelectric memory device.

FIG. 8 is a schematic circuit diagram illustrating a 4×4 memory cell arrangement and a decoder of the ferroelectric memory device. The memory cell arrangement is made in the same manner as the foregoing illustration in FIG. 6 and FIG. 7. Also, word lines from the ferroelectric transistors of the memory cells arranged in same row and the well lines are commonly connected to a decoding signal applied from the decoder 220.

The decoder is composed of the first decoder 221 and the second decoder 222. The first decoder decodes address signal $a_2$ and $a_3$ applied from the outside, then selectively drives one word line among a plurality of word lines $WL_1$–$WL_n$. Also, the second decoder decodes address signal $a_0$ and $a_1$ applied from the outside, then selectively drives one well line among the multiple well lines $WELL_1$–$WELL_m$. The decoder 220 structure is similar to the existing structure, only it is different that the decoding output signal from the second decoder 222 is connected to the well lines.

In general, the threshold voltage of the single ferroelectric transistor rises when the single ferroelectric transistor is programmed, while the threshold voltage of the single ferroelectric transistor is the same value as normal MOS transistor's threshold voltage when the single ferroelectric transistor is not programmed.

For reading the information stored in the selected memory cell located arbitrarily, a reading voltage is applied to the common word line of the selected memory cell and a sensing voltage is applied to the bit line and the source line. For example, when reading memory cell is a programmed cell, the reading voltage applied to the single ferroelectric transistor's gate is lower than the threshold voltage. Then the single ferroelectric transistor is turned off and current scarcely flows. On the other hand, when reading memory cell is a non-programmed cell, the reading voltage applied to the single ferroelectric transistor's gate is higher than the threshold voltage. Thus, the single ferroelectric transistor is turned on and current flows. Subsequently, a sense amp (not shown) connected to the bit lines, senses the difference of both current, then the information stored in the selected memory cell is read.

Although the present invention has been described in terms of various embodiments, it is not intended that the invention be limited to these embodiments. Modification within the spirit of the invention will be apparent to those skilled in the art.

The advantage of the ferroelectric memory device organized the single ferroelectric transistor is that one unit memory cell is independently selected and is programmed, when the unit memory cell is programmed for "the first state" or "the second state" by applying the DC bias voltage to all the single ferroelectric transistor's gate and well. Another advantage is to prevent the write disturb phenomenon from programming the unit memory cell without separate circuit. In addition, the ferroelectric memory device can be driven with normal power level $V_{dd}$ and GND.

What is claimed is:

1. A ferroelectric memory device, comprising:
    a plurality of word lines arranged in a column direction;
    a plurality of bit lines and a plurality of source lines arranged in a row direction and crossed said plurality of word lines; and
    a plurality of unit memory cells arranged in a matrix,
    wherein each of said plurality of unit memory cells comprises a single ferroelectric transistor which is coupled between corresponding one of said source lines and corresponding one of said bit lines and whose gate is connected to corresponding one of said word lines;
    wherein said single ferroelectric transistor comprises a well which is connected to one common well line in the column direction and is electrically isolated from common well lines of adjacent different columns; and
    wherein said single ferroelectric transistor comprises a source commonly connected to said bit line or said source line in the column direction and comprises a drain commonly connected to said bit line or said source line in the column direction.

2. The device as claimed in claim 1, wherein for programming one unit memory cell among the plurality of unit memory cells for an arbitrary "a first state", the programming method comprising steps of:
    programming the selected unit memory cell for said "the first state" by applying a first level voltage to the corresponding word line connected to said gate of said single ferroelectric transistor in said unit memory cell and by applying a second level voltage to the corresponding common well line;
    holding on to an initial polarization by applying the first level voltage to the common well line of said single ferroelectric transistor in said unit memory cell among the unselected unit memory cells commonly connected to the word line of said selected unit memory cell; and
    holding on to the initial polarization by applying the first level voltage to the common well line of said single ferroelectric transistor in the other unselected unit memory cells among the unselected unit memory cells and by applying said second level voltage to the corresponding word line connected to the gate.

3. The device as claimed in claim 2, wherein the one unit memory cell among said plurality of unit memory cells is programmed for an arbitrary "a second state", the programming method comprising steps of:
    programming the selected unit memory cell for said "the second state" by applying said second level voltage to the corresponding word line connected to said gate of said single ferroelectric transistor in said unit memory cell and by applying said first level voltage to the corresponding common well line;
    holding on to the initial polarization by applying the second level voltage to the common well line of said single ferroelectric transistor in said unit memory cell among the unselected unit memory cells commonly connected to the word line of said selected unit memory cell; and
    holding on to the initial polarization by applying the first level voltage to the corresponding word line connected to the gate of said single ferroelectric transistor in the other unselected unit memory cells among the unselected unit memory cells and by applying the second level voltage to the corresponding common well line.

4. The device as claimed in claim 2, wherein said first level voltage is a source voltage applied to said ferroelectric memory device and said second level voltage is a ground voltage.

5. The device as claimed in claim 3, wherein said first level voltage is a source voltage applied to said ferroelectric memory device and said second level voltage is a ground voltage.

6. The device as claimed in claim 1, wherein said common well line of said single ferroelectric transistors arranged in the same column is selected based on a decoding output signal applied from a decoding means which decodes address signals applied from the outside.

7. The device as claimed in claim 6, wherein said decoding means comprises:

a first decoding means which decodes the address signals applied from the outside, then selectively drives one word line among said plurality of word lines;

a second decoding means which decodes the address signals applied from the outside, then selectively drives one common well line among said plurality of common well lines; and wherein said decoding output signal of the second decoding means is connected to the common well line of said single ferroelectric transistors arranged in the same column.

* * * * *